United States Patent [19]

Chung

[11] Patent Number: 4,832,609
[45] Date of Patent: May 23, 1989

[54] SOLDERLESS CIRCUIT CONNECTION FOR BOWED CIRCUIT BOARD

[75] Inventor: Andrew Chung, Rochester, N.Y.

[73] Assignee: Eastman Kodak Company, Rochester, N.Y.

[21] Appl. No.: 125,838

[22] Filed: Nov. 27, 1987

[51] Int. Cl.⁴ ............................................. H01R 9/09
[52] U.S. Cl. .................................... 439/67; 439/493; 361/398
[58] Field of Search ...................... 439/65–67, 439/74, 370, 493; 361/398

[56] References Cited

U.S. PATENT DOCUMENTS

| | | | |
|---|---|---|---|
| 3,114,587 | 12/1963 | Herrmann | 439/329 |
| 3,378,808 | 4/1968 | French | 439/492 |
| 3,500,289 | 3/1970 | Herb | 439/67 |
| 3,509,296 | 4/1970 | Harshman et al. | 439/66 X |
| 3,597,660 | 8/1971 | Jensen et al. | 361/398 |
| 3,612,744 | 10/1971 | Thomas | 174/36 |
| 3,825,878 | 7/1974 | Finger et al. | 439/49 |
| 3,851,294 | 11/1974 | Palazzetti et al. | 439/272 |
| 3,977,756 | 8/1976 | Rodondi | 439/357 |
| 4,060,889 | 12/1977 | Zielinski | 29/628 |
| 4,169,641 | 10/1979 | Olsson | 439/493 |
| 4,265,507 | 5/1981 | Johnson | 439/49 |
| 4,468,074 | 8/1984 | Gordon | 439/296 |
| 4,583,800 | 4/1986 | Roberts et al. | 439/64 |
| 4,647,125 | 3/1987 | Londi et al. | 439/67 |
| 4,679,868 | 7/1987 | Hasircoglu | 439/495 |
| 4,691,972 | 9/1987 | Gordon | 361/398 X |
| 4,740,867 | 4/1988 | Roberts et al. | 439/67 X |

*Primary Examiner*—Eugene R. LaRoche
*Assistant Examiner*—Benny Lee
*Attorney, Agent, or Firm*—Roger A. Fields

[57] ABSTRACT

An elastomer pad which applies a compressive force against a flexible printed circuit to bias substantially parallel terminal portions of the printed circuit into electrical contact with substantially parallel terminal portions of a hardboard printed circuit is supported by an arched rib-like member to provide a uniform force at the respective locations of electrical contact. This assures a uniform impedance from one pair of contacting terminal portions to the next pair should the hardboard printed circuit be slightly bowed crosswise of its terminal portions by the compressive force of the elastomer pad.

1 Claim, 3 Drawing Sheets

SOLDERLESS CIRCUIT CONNECTION FOR BOWED CIRCUIT BOARD

CROSS-REFERENCE TO A RELATED APPLICATION

Reference is made to commonly assigned, copending U.S. patent application Ser. No. 125,837, filed Nov. 27, 1987 in the name of Andrew Chung and Douglas H. Pearson and entitled SOLDERLESS CIRCUIT CONNECTION APPARATUS AND METHOD.

BACKGROUND OF THE INVENTION

1. Field of the Invention

The invention relates generally to apparatus for interconnecting electrical circuit elements and more particularly to a solderless circuit connection for establishing and maintaining electrical contact between the circuit elements.

2. Descripton of the Prior Art

A conventional method of interconnecting electrical circuit components consists of soldering terminals located on the respective components to conductors which deliver current to or from the components. While generally suitable for its intended purposes, interconnecting electrical components via soldering terminals does suffer from certain drawbacks and deficiencies. For example, the substrate which supports an exposed terminal must be able to withstand relatively high temperatures with no adverse effects. Moreover, soldering connections can be time consuming, and therefore can be labor intensive and expensive. Another problem with soldered connections is the relative difficulty in disconnecting a soldered terminal during repairs and manufacturing.

In some applications it has been found desirable to replace soldering as a technique for use in establishing connections to flexible and other circuits. In these applications the requisite electrical contact may be established by mechanically pressing the terminal portions of the circuit against terminal pads on the connector, device or another cirtcuit. Such prior art pressure connections are customarily made with the aid of a solid resilient pressure applicator, such as an elastomeric member, which is placed in compression to bias at least one of the components to be electrically interconnected toward the other component to hold the terminal portions of the respective components in electrical contact.

Typically, a flexible printed circuit and a hardboard printed circuit are held with the terminal portions of their respective electrical conductors in electrical contact by being sandwiched between a nonconducting rigid bracket and a nonconducting rigid base. The bracket is screwed or otherwise mechanically connected to the base, and thereby compresses an elastomer pad to bias the flexible printed circuit into electrical contact with the hardboard printed circuit. Additional prior art examples illustrating the use of a bracket or other suitable clamping means for holding the flexible and hardboard printed circuits in electrical contact are shown in U.S. Pat. Nos. 3,825,878, granted July 23, 1974; 3,977,756, granted Aug. 31, 1976; 4,468,074, granted Aug. 28, 1984; and 4,610,495, granted Sep. 9, 1986. A shortcoming of these prior art examples is that they each must employ a rigid bracket or clamp to hold the flexible and hardboard printed circuits in electrical contact. This adds to the size, expense, and complexity of the assemblage.

THE CROSS-REFERENCED APPLICATION

The patent application cross-referenced above discloses a solderless circuit connection which eliminates the prior art requirement of a rigid bracket or other clamping means for holding the flexible and hardboard printed circuits in electrical contact. Instead, the circuit connection makes use of the inherent stiffness of the hardboard printed circuit to hold that printed circuit and the flexible printed circuit in electrical contact. Moreover, it accomplishes this in a relatively simple and practical manner.

Specifically, an elastomer pad is compressed to apply a force against a flexible printed circuit to bias substantially parallel terminal portions of the printed circuit into electrical contact with corresponding terminal portions of a hardboard printed circuit, thereby maintaining a solderless connection between the two printed circuits. The solderless connection is assembled by first positioning the elastomer pad and the flexible printed circuit between the hardboard printed circuit nd a substantially flat nonconducting rigid support for the pad, and then mechanically connecting the hardboard printed circuit and the rigid support. This method uses the inherent stiffness of the hardboard printed circuit, connected to the rigid support, to create the necessary compression of the elastomer pad. Thus it eliminates the prior art need for an additional bracket or clamp.

If in this assemblage the widths of the hardboard and flexible printed circuits are substantially increased to permit a like addition of more terminal portions to each of the printed circuits, it is possible that the hardboard printed circuit (because of the increase in width and an insufficient beam strength) may be slightly bowed crosswise of its terminal portions by the force of the elastomer pad. This problem is illustrated in FIG. 2A of the accompanying drawings, wherein there is shown a hardboard printed circuit 1 and a flexible printed circuit 3 positioned in a mutually bowed relation with their respective terminal portions 5 and 7 in electrical contact; an elastomer pad 9; a nonconducting rigid support 11 having a recess 13 in which the elastomer pad is partially contained; and screws 15 mechanically connecting the rigid support and the hardboard printed circuit. Since in FIG. 2A the elastomer pad 9 is less compressed at a midpoint 17 s compared to at opposite longitudinal end points 19 and 19', the force the elastomer pad applies against the flexible printed circuit 3 proximate such midpoint is less than the force the pad applies against that printed circuit proximate such end points. The result of this effect is to vary by degree the electrical contact between the respective terminal portions 5 and 7 of the hardboard and flexible printed circuits 1 and 3. In particular, the electrical contact between the respective terminal portions is greatest where the elastomer pad 9 is most compressed (i.e., at its end points 19 and 19') and is least where the pad is least compressed (i.e., at its midpoint 17). This disparity, as indicated in FIG. 2B, causes the impedance to be nonuniform from one pair of contacting terminal portions to the next pair. In particular, the impedance is strongest where the electrical contact is least and is weakest where the electrical contact is greatest.

SUMMARY OF THE INVENTION

According to the invention, an elastomer pad which applies a compressive force against a flexible printed circuit to bias substantially parallel terminal portions of the printed circuit into electrical contact with substantailly parallel terminal portions of a hardboard printed circuit is supported by an arched rib-like member to provide a uniform force at the respective locations of electrical contact. This assures a uniform impedance from one pair of contacting terminal portions to the next pair should the hardboard printed circuit be slightly bowed crosswise of its terminal portions by the compressive force of the elastomer pad.

DESCRIPTION OF THE PREFERRED EMBODIMENT

Figure 1:
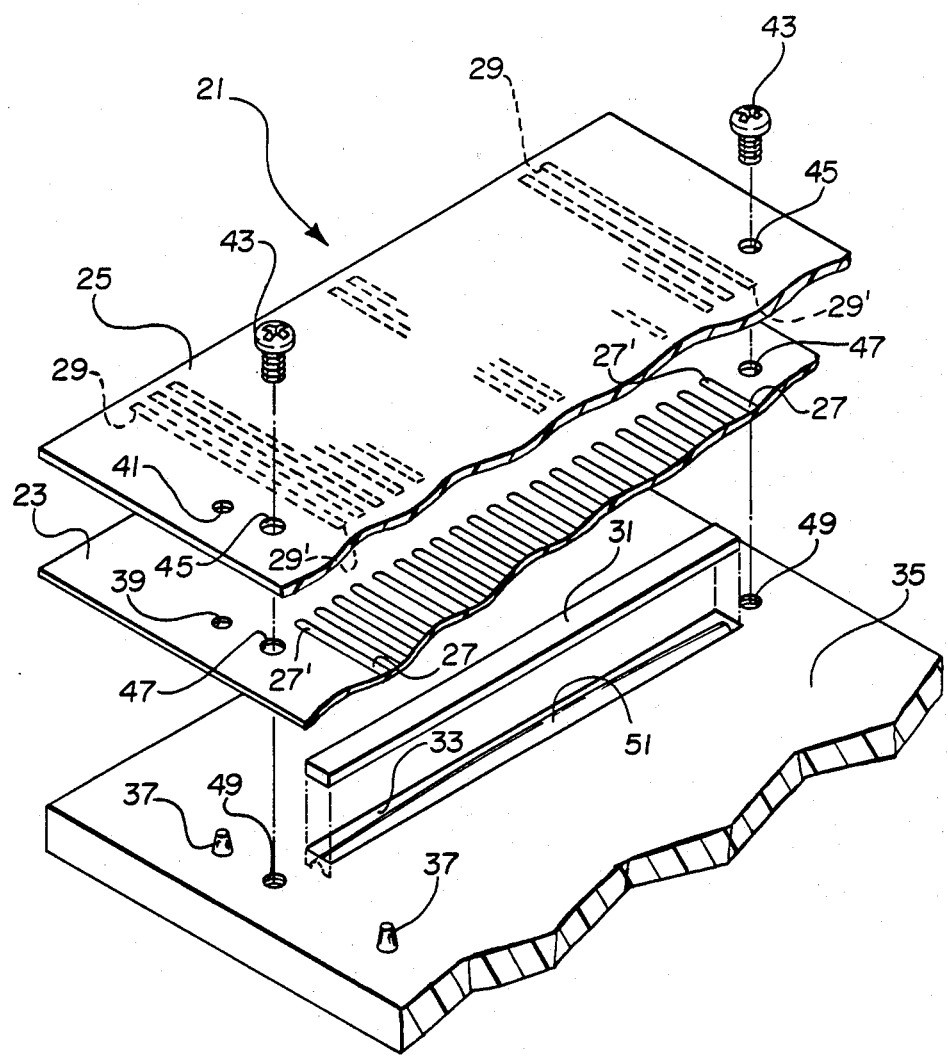
FIG. 1 is an exploded perspective view of a solderless circuit connection in accordance with a preferred embodiment of the invention.
Figure 2A:
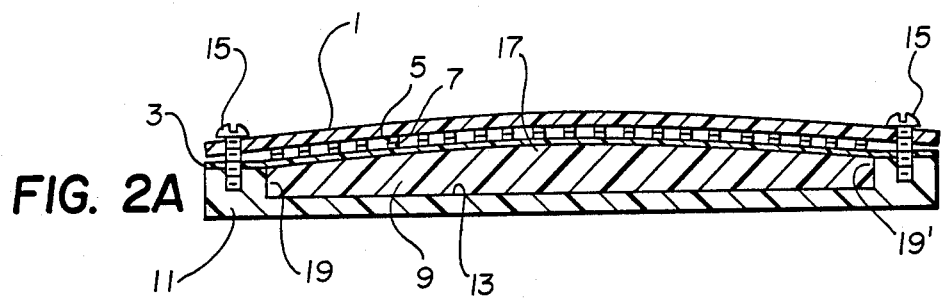
FIG. 2A is an elevation view in section of a solderless circuit connection which is different than the one depicted in FIG. 1, illustrating a problem that may arise susing the former circuit connection.
Figure 2B:
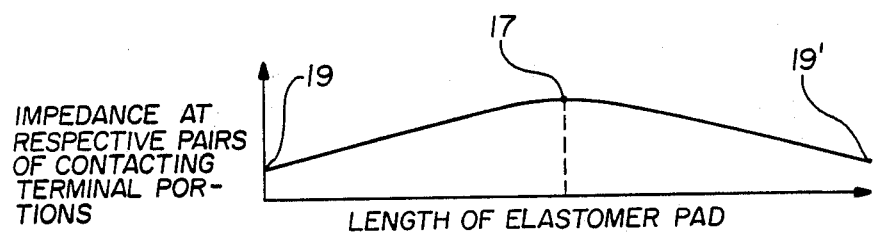
FIG. 2B is a graph, illustrating the nonuniform impedance that results using the solderless circuit connection of FIG. 2A.

Referring now to the drawings and in particular to FIG. 1, there is depicted a method of assembling a solderless circuit connection 21 in accordance with a preferred embodiment of the invention. The solderless circuit connection 21 is of the type wherein a known flexible printed circuit 23 and a known hardboard printed circuit 25 are intended to be held in electrical contact with the respective terminal portions 27', 29' of substantially parallel electrical conductors 27 and 29 of the two printed circuits pressed against one another. According to the method of assembly, an elastomer pad 31 (e.g., silicon rubber) is placed in a recess 33 formed in a plate-like, nonconducting rigid base 35. The elastomer pad 31 has a height which is greater than the depth of the recess 33, and therefore it projects partially out of the recess.

After the elastomer pad 31 is placed in the recess 33 of the rigid base 35, the flexible printed circuit 23 is positioned above the base with its electrical conductors 27 facing upwardly, as viewed in FIG. 1. The flexible printed circuit 23 rests on top of the elastomer pad 31, and it is oriented such that a plurality of alignment pins 37 fixed to the base 35 project through corresponding alignment holes 39 (only one shown) in the flexible printed circuit to hold the flexible printed circuit stationary with respect to the base. Then, the hardboard printed circuit 25 is positioned on top of the flexible printed circuit 23 with the terminal portions 29' of the electrical conductors 29 resting on the terminal portions 27' of the electrical conductors 27. When the hardboard printed circuit 25 is positioned as described, the alignment pins 37 project through corresponding alignment holes 41 (only one shown) in the hardbord printed circuit to hold the hardboard printed circuit stationary with respect to the base 35. At this time, the elastomer pad 31 is not compressed, and it continues to extend partially out of the recess 33.

Figure 3A:
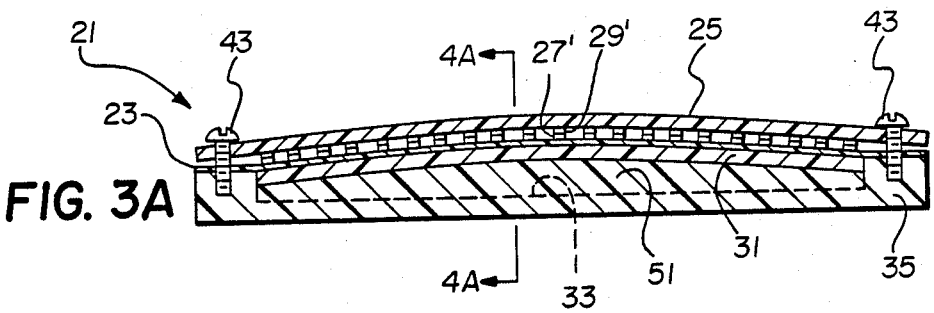
FIG. 3A is an elevation view in section of the solderless circuit connection depicted in FIG. 1.

Finally, as shown in FIGS. 1 and 3A, a plurality of screws 43 are inserted through respective aligned openings 45 and 47 in the hardboard and flexible printed circuits 25 and 23, and they are screwed into corresponding threaded wells 49 in the rigid base 35. This places the elastomer pad 31 in compression to bias the flexible printed circuit 23 into electrical contact with the hardboard printed circuit 25.

The widths of the flexible and hardboard printed circuits 23 and 25 in FIG. 3A are dimensionally greater than the widths of the flexible and hardbord printed circuits in the patent application cross-referenced above. This is done in order to accommodate a increase in the number of the contacting terminal portions 27' and 29' for the flexible and hardboard printed circuits 23 and 25, as compared to the number of the contacting terminal portions for the flexible and hardboard printed circuits in the cross-referenced application. Consequently, however, the hardboard printed circuit 25 (because of an insufficient proportion of its beam strength to its increased width) is bowed crosswise of its terminal portions 29' by the compressive force the elastmer pad 31 exerts against the flexible printed circuit 23. This is illustrated in FIG. 3A.

Figure 3B:
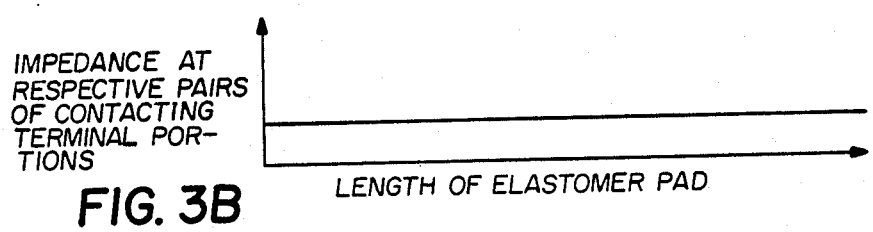
FIG. 3B is a graph, illustrating the uniform impedance that results using the solderless circuit connection of FIG. 1A.
Figure 4A:
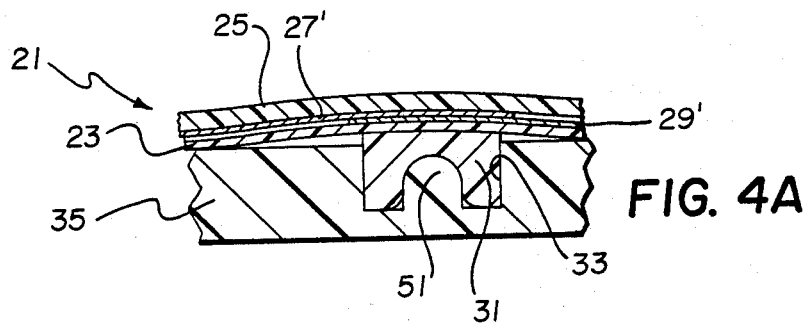
FIG. 4A is a cross-section view as seen in the direction of the arrows from the line 4A—4A in FIG. 3A.

According to the invention, a nonconducting rigid rib-like member 51 is integrally formed with the rigid base 35. The rib-like member 51, as illustrated in FIGS. 1, 3A, and 4A, is disposed within the recess 33 of the base 35, and is embedded in the elastomer pad 31 to compress the pad in cooperation with the hardboard printed circuit along a relatively narrow section of the pad extending crosswise of the contacting terminal portions 27' and 29' of the flexible and hardboard printed circuits. As best seen in FIG. 3A, the rib-like member 51 is arched substantially in conformity with the bowing of the hardboard printed circuit 25. The arch of the rib-like member 51 compensates for the bowing of the hardboard printed circuit 25 in order to maintain the elastomer pad 31 uniformly compressed along its length. The result of this effect is to create a uniform impedance from one pair of contacting terminal portions 27' and 29' to the next pair, due to the uniform force applied by the elastomer pad 31 at the discrete locations of electrical contact between the respective terminal portions. See FIG. 3B.

Figure 4B:
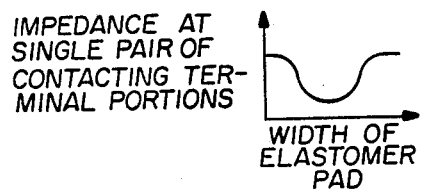
FIG. 4B is a graph, illustrating the uniform impedance that results using the solderless circuit connection as viewed in FIG. 4A.

FIG. 4A is a cross-section view of the solderless circuit connection 21 as seen in the direction of the arrows from the lines 4A—4A in FIG. 3A, and it depicts the manner in which the rib-like member 51 is embedded in the elastomer pad 31. FIG. 4B indicates the impedance at each pair of contacting terminal portions 27' and 29', measured lengthwise of such terminal portions. This is in contrast to FIG. 3B which shows the impedance from one pair of contacting terminal portions to the next pair, measure crosswise (i.e., widthwise) of such terminal portions.

While the invention has been described with reference to a preferred embodiment, it will be understood that various modifications may be effected within the ordinary skill in the art without departing from the scope of the invention. For exampale, it is not always necessary for the rib-like member 51 to be arched. The rib-like member 51 need not be arched when the hardboard printed circuit 25 is only very slightly bowed. In such a case, the rib-like member 51 (without it being arched) would effect a sufficient compression of the elastomer pad 31 to assure a substantially uniform impedance from one pair of contacting terminal portions 27' and 29' to the next pair.

I claim:

1. An improved solderless circuit connection of the type wherein (a) a resilient pressure applicator is compressed to apply a force against a flexible printed circuit to bias substantially parallel terminal portions of that printed circuit into respective electrical contact with substantially parallel terminal portions of a hardboard printed circuit and (b) said hardboard printed circuit is slightly bowed along a hardboard section transverse of its parallel terminal portions by said force of the pressure applicator, and wherein the improvement comprises:

a non-conducting rigid longitudinal rib member secured to said hardboard printed circuit in a closely spaced relation, with said flexible printed circuit and said pressure applicator being positioned between said hardboard printed circuit and said rib member, and said rib member being arched lengthwise substantially in conformity with the bowing of said hardboard section of the hardboard printed circuit and disposed to compress said pressure applicator in cooperation with said hardboard printed circuit along a relatively narrow section of the pressure applicator transverse of the respective terminal portions of said flexible and hardboard printed circuits, whereby said rib member compensates for the bowing of said hardboard section in order to effect compression of said pressure applicator in a uniform manner adjacent the respective terminal portions of the flexible and hardboard printed circuits.

* * * * *

UNITED STATES PATENT OFFICE
CERTIFICATE OF CORRECTION

PATENT NO. : 4,832,609
DATED : May 23, 1989
INVENTOR(S) : Andrew Chung

It is certified that error appears in the above-identified patent and that said Letters Patent is hereby corrected as shown below:

Column 2, line 24, "nd" should read --and--
Column 2, line 50, "s" should read --as--
Column 3, lines 5-6, "substantailly" should read --substantially--
Column 3, line 23, "susing" should read --using--
Column 3, line 31, "1A" should read --3A--
Column 5, line 2, "exampale" should read --example--.

Signed and Sealed this

Eighth Day of May, 1990

Attest:

HARRY F. MANBECK, JR.

*Attesting Officer*  *Commissioner of Patents and Trademarks*